United States Patent [19]
DeVeirman et al.

[11] Patent Number: 5,289,136
[45] Date of Patent: Feb. 22, 1994

[54] BIPOLAR DIFFERENTIAL PAIR BASED TRANSCONDUCTANCE ELEMENT WITH IMPROVED LINEARITY AND SIGNAL TO NOISE RATIO

[75] Inventors: Geert A. DeVeirman, Irvine; Paul R. Henneuse, Cupertino, both of Calif.

[73] Assignee: Silicon Systems, Inc., Tustin, Calif.

[21] Appl. No.: 999,195

[22] Filed: Dec. 28, 1992

Related U.S. Application Data

[63] Continuation of Ser. No. 710,512, Jun. 4, 1991, abandoned.

[51] Int. Cl.$^5$ .............................. H03F 3/45
[52] U.S. Cl. ...................... 330/252; 330/261
[58] Field of Search .............. 330/252, 261, 295, 149, 330/124 R

[56] References Cited
U.S. PATENT DOCUMENTS
5,006,818  4/1991  Koyama et al. .................. 330/261

*Primary Examiner*—Steven Mottola
*Attorney, Agent, or Firm*—Hecker & Harriman

[57] ABSTRACT

A bipolar differential pair based transconductance element with improved linearity and signal to noise ratio is described. The circuit of the present invention comprises two sets of differential pairs of bipolar transistors in parallel. Each differential pair implements transistor area ratios in the emitter areas. The present invention also comprises diodes that are coupled to the emitters of the transistors of the differential pairs. When the device areas are ratioed properly, the range for the input voltage signal that still allows a linear output current equation increases by a factor of 2 over prior art circuits. The improved linearity, as well as improved signal-to-noise ratio, is achieved by coupling the diodes to the emitters of the transistors and also having the differential pairs in parallel with their transistor areas proportional to each other. An alternative embodiment of the present invention is also described which also uses a level shifting stage. In this embodiment, the required ratios can be set by means of the level shift transistors allowing for the use of all identical core transistors and diodes. Since all the identical core transistors and diodes are minimum size, this reduces the parasitics and extends the high frequency operating range of the circuit.

16 Claims, 7 Drawing Sheets

BIPOLAR DIFFERENTIAL PAIR BASED TRANSCONDUCTANCE ELEMENT WITH IMPROVED LINEARITY AND SIGNAL TO NOISE RATIO

This is a continuation of application Ser. No. 710,512 filed Jun. 4, 1991, now abandoned.

BACKGROUND OF THE PRESENT INVENTION

1. Field of the Invention

This invention relates to the field of analog integrated circuits in general and circuitry for improving the linear operating range and the signal to noise ratio (SNR) of differential bipolar transconductance elements in particular.

2. Background Art

A transconductance element is a circuit element that converts a voltage input into a current output. The output of a transconductance element is dependent on its gain, measured in units of "conductance." The gain of a transconductance element is determined by the ratio of its output current, $I_O$, to the input voltage, $V_{IN}$. This ratio $I_O/V_{IN}$ is called the "transconductance" and is referred to as $g_m$.

Typically, a transconductance element has two voltage inputs, $V_1$ and $V_2$. In so-called "normal" mode, the input voltages are changed differentially, independent of each other. In "common" mode, both input voltages change levels together. Common mode transconductance elements are often used as linear amplifiers. A measure of the performance of a transconductance element operating as a linear amplifier is the "common mode rejection ratio" (CMRR).

The differential output of a transconductance element-based linear amplifier is given by:

$$I_O = g_{md}(V_1 - V_2) + g_{mcm}\left(\frac{V_1 + V_2}{2}\right)$$

where $I_O$ is equal to the differential transconductance $g_{md}$ multiplied by the difference between input signals $V_1$ and $V_2$ plus the common mode transconductance $g_{mcm}$ multiplied by the sum of $V_1$ and $V_2$ divided by two. Ideally, it is desirable to suppress the common-mode component, (a non-linear component). Therefore, to achieve linear gain from differential pairs, they are designed so that the ratio of the differential gain to the common-mode gain, the CMRR, is as high as possible. CMRR is usually specified in decibels. The common-mode input range is the voltage level over which the inputs may vary.

It is desirable that differential amplifiers be easily tunable, be simple in design to avoid excess phase effects caused by unavoidable parasitics, and be linear over a large input voltage range to guarantee a high dynamic range. Fully-differential circuits are used for their higher power supply rejection ratio (PSRR) and CMRR.

However, fully-differential circuits often suffer from a limited linear operating range. An example of a typical fully-differential circuit suffering this drawback is the emitter-coupled pair. A small range in linearity implies that the circuit can receive input voltage values only over a small range before resulting in non-linear outputs. Also, many designs of fully-differential circuits do not have a high signal-to-noise ratio level. Having a low equivalent noise resistance in amplifiers increases the performance of the amplifier by preventing the signal from being obstructed by noise.

A number of prior art transconductance-based amplifiers have been developed. These include emitter-coupled pair, series diode linearization, transistor ratio linearization, two differential pairs with ratios in parallel, and amplifiers using level shift techniques. These prior art amplifiers are described below.

EMITTER COUPLED PAIR

In FIG. 1, input voltage signal $V_i$ 1 is differentially coupled to the bases of transistors Q1 and Q2. The emitters of transistors Q1 and Q2 are coupled to each other at node 5 where they are also coupled to the ground through current source 4 $I_{EE}$. The collector of transistor Q1 is coupled to current source 2 at node 6. The collector of transistor Q2 is coupled to current source 3 at node 7. Voltage supply VCC is also coupled to current source 2 and current source 3. The differential output current value is taken from the difference in current values of the two collectors at nodes 6 and 7.

It is necessary to derive the DC transfer characteristic of FIG. 1 in order to find the maximum allowable input voltage for linear operation of the emitter-coupled pair. Summing the voltages around the loop consisting of $V_i$ and the two base-emitter junctions (Q1 and Q2) yields:

$$V_i - V_{BE1} + V_{BE2} = 0. \tag{1}$$

Assuming that $V_{BE1}$ and $V_{BE2}$ are much greater than $V_T$, and applying the Ebers-Moll circuit analysis equations it can be seen that $$V_{BE1} = V_T \ln \frac{I_{C1}}{I_{S1}} \tag{2}$$

$$V_{BE2} = V_T \ln \frac{I_{C2}}{I_{S2}} \tag{3}$$

where $I_{S1}$ and $I_{S2}$ are the collector saturation currents of the respective BJT transistors Q1 and Q2, and $V_T$ is the thermal voltage. Combining equations (1) through (3), and assuming that $I_{S1} = I_{S2}$ (i.e. both transistors match perfectly), one finds:

$$\frac{I_{C1}}{I_{C2}} = \exp\left(\frac{V_i}{V_T}\right) \tag{4}$$

summing the currents at the emitters of the transistors, $$I_{E1} + I_{E2} = I_{EE} = \frac{I_{C1} + I_{C2}}{\alpha} \tag{5}$$

where $\alpha = \frac{\beta}{\beta + 1}$ and $\beta = \frac{I_C}{I_B}$ where $I_C$ and $I_B$ are the collector and base currents respectively. Combining equations (4) and (5) yields:

$$I_{C1} = \frac{\alpha I_{EE}}{1 + \exp\left(-\frac{V_i}{V_T}\right)} \tag{6}$$

and $$I_{C2} = \frac{\alpha I_{EE}}{1 + \exp\left(\frac{V_i}{V_T}\right)} \quad (7)$$

After substituting the equations (6) and (7):

$$I_O = I_{C2} - I_{C1} = \alpha I_{EE} \frac{1 - \exp\left(\frac{V_i}{V_T}\right)}{1 + \exp\left(\frac{V_i}{V_T}\right)} = \quad (8)$$

$$-\alpha I_{EE} \tanh\left(\frac{V_i}{2V_T}\right)$$

This DC transfer characteristic ($I_O/\alpha I_{EE}$ vs. $V_i/V_T$) is illustrated in FIG. 2. It is clear from FIG. 2 that the transfer characteristic is only linear for input voltages up to the order of magnitude $2V_T$. For sufficiently small peak-to-peak input voltage, i.e. $V_{i,pp}$, the quantity $$\tanh\left(\frac{V_i}{2V_T}\right)$$

is approximately equal to $$\frac{V_i}{2V_T}.$$

Therefore, $$I_O = \frac{-\alpha I_{EE}}{2V_T} V_i = -g_m V_i \quad (9)$$

where $$g_m = \frac{\alpha I_{EE}}{2V_T} \quad (10)$$

Thus, the transconductance, $g_m$, can be tuned by varying the tail current $I_{EE}$. Equivalent input noise voltage $V_N$ of the emitter-coupled pair of FIG. 1 equals $$\frac{V_N}{\sqrt{\Delta f}} = \sqrt{4KT\left(2R_B + \frac{1}{g_m}\right)} \quad (11)$$

where
K: Boltzman's constant
T: absolute temperature
$R_B$: base resistance of transistor Q1 (or Q2)
$g_m$: transconductance defined in equation (10).

$$R_{eqn} = \left(2R_B + \frac{1}{g_m}\right)$$

is commonly referred to as the equivalent noise resistance of the circuit.

SERIES DIODE LINEARIZATION TECHNIQUE

One example of an existing linearization technique for differential amplifiers is illustrated in FIG. 3 which shows a pair of diodes being inserted between the emitters of the NPN BJT transistors. Similar to the analysis for the simple emitter-coupled pair of FIG. 1, a voltage loop equation can be written.

$$V_i - V_{BE1} - V_{D1} + V_{D2} + V_{BE2} = 0 \quad (12).$$

Where $$V_{D1} = V_T \ln \frac{I_{D1}}{I_{DS1}} = V_T \ln \frac{I_{E1}}{I_{DS1}} = V_T \ln \frac{I_{C1}}{\alpha_1 I_{DS1}} \quad (13)$$

and $$V_{D2} = V_T \ln \frac{I_{D2}}{I_{DS2}} = V_T \ln \frac{I_{E2}}{I_{DS2}} = V_T \ln \frac{I_{C2}}{\alpha_2 I_{DS2}}. \quad (14)$$

With the exception of the diodes, the architecture of FIG. 3 is similar to FIG. 1. Input voltage signal $V_i$ 1 is differentially coupled to the bases of transistors Q1 and Q2. The emitter of transistor Q1 is coupled to the anode of diode 10 D1, while the cathode of diode 10 D1 is coupled to the cathode of diode D2 11 at node 5. Node 5 is coupled to the ground through current source 4 $I_{EE}$. The collector of transistor Q1 is coupled to current source 2 $I_{EE}/2$ at node 6. Voltage $V_{cc}$ is coupled to current sources 2 and 3. The collector of transistor Q2 is coupled to current source 3 at node 7 while the emitter of transistor Q2 is coupled to the anode of diode D2 11. The collector currents for transistors Q1 and Q2 can be found by substituting equations (2), (3), (13), and (14) into (12), and also assuming matching between like components.

$$I_{C1} = \frac{\alpha I_{EE}}{1 + \sqrt{\exp\left(-\frac{V_i}{V_T}\right)}} = \frac{\alpha I_{EE}}{1 + \exp\left(-\frac{V_i}{2V_T}\right)}. \quad (15)$$

$$I_{C2} = \frac{\alpha I_{EE}}{1 + \sqrt{\exp\left(d, 4\frac{V_i}{V_T}\right)}} = \frac{\alpha I_{EE}}{1 + \exp\left(\frac{V_i}{2V_T}\right)} \text{ and} \quad (16)$$

$$I_O = I_{C2} - I_{C1} = \alpha_{EE} \frac{1 - \exp\left(\frac{V_i}{2V_T}\right)}{1 + \exp\left(\frac{V_i}{2V_T}\right)} \quad (17)$$

or $$I_O = -\alpha I_{EE} \tanh\left(\frac{V_i}{4V_T}\right). \quad (18)$$

The transfer characteristic ($I_O/\alpha I_{EE}$ vs. $V_i/V_T$) of equation (18) is illustrated in FIG. 4. The insertion of the two diodes in the differential amplifier doubles the linearity range of the input voltage signal as compared to FIG. 2. The input signal still is limited to less than 100 mV peak-to-peak (approximately 4 $V_T$).

As in the previous case, for sufficiently small input voltage, i.e. $V_{i,pp} \leq 4 V_T$, the quantity tanh $\left(\frac{V_i}{4V_T}\right)$ is approximately equal to $V_i/4\ V_T$. Hence, $$I_O \approx -\alpha I_{EE}\left(\frac{V_i}{4V_T}\right) = \frac{g_m V_i}{2} \qquad (19)$$

with $g_m$ defined previously in equation (10). Equation (19) shows that the effective transconductance remains tunable by varying the tail current $I_{EE}$. One undesirable effect of using the diodes, however, is that the value of the transconductance has been reduced by 50%, thus losing half of the input voltage to output current gain.

Furthermore, the noise resistance of the circuit is doubled. Combined with twice the linear range, this results in $\sqrt{2}$ times the SNR compared to the differential pair in FIG. 1. The SNR can be further increased if, to maintain the same transconductance as for FIG. 1, the tail current (and as a result, the circuit's power dissipation) is doubled. In this situation, $$R_{eqn} = \left(2R_B + \frac{1}{g_m}\right),$$

with all terms as defined above. By choosing large transistors, $R_B$ can often be made negligible compared to $$\frac{1}{g_m}.$$

In this limit case, the SNR improvement can approach a factor of 2.

TRANSISTOR RATIO LINEARIZATION TECHNIQUE

Another linearization technique that has been used in prior art is employing transistors with different transistor area. FIG. 5 shows an emitter-coupled pair with a 1:r ratio between the transistor emitter areas (or equivalently between their saturation currents i.e. $I_{S4} = r\ I_{S3}$). Applying the same analysis used for the emitter coupled pair of FIG. 1 to the circuit of FIG. 5, the new expressions for equations (4) and (8) now include a ratio dependent term.

$$\frac{I_{C1}}{I_{C2}} = \exp\left(\frac{V_i}{V_T} - \ln(r)\right) \qquad (20)$$

$$I_O = I_{C2} - I_{C1} = -\alpha I_{EE} \tanh\left(\frac{V_i}{2V_T} - \frac{\ln(r)}{2}\right). \qquad (21)$$

TWO DIFFERENTIAL PAIRS WITH RATIOS IN PARALLEL TECHNIQUE

The nonlinear relationship in the output current equation (21) can be linearized by putting two differential pairs with respective emitter area ratios of 1:r and r:1 in parallel, as shown in FIG. 6. Note that to maintain the power consumption constant, each differential pair in FIG. 6 has a tail current equal to $$\frac{I_{EE}}{2}.$$

In FIG. 6, the input voltage signal $V_i$ 1 is coupled differentially to the bases of transistors Q3 and Q4 as well as being coupled differentially to bases of transistors Q5 and Q6. The collectors of transistors Q3 and Q5 are coupled to each other at node 6 as well as being coupled to current source 2, $$\frac{I_{EE}}{2}.$$

The collectors of transistors Q4 and Q6 are coupled to each other at node 7 as well as being coupled to current source 3

$$\frac{I_{EE}}{2}.$$

Voltage supply $V_{CC}$ is also coupled to current sources 2 and 3. The emitters of transistors Q3 and Q4 which have a transistor area ratio of 1:r, are coupled to each other at node 5 where they are also coupled to current source 4

$$\frac{I_{EE}}{2}.$$

The emitters of transistors Q5 and Q6 which have a transistor area ratio of r:1, are coupled to each other at node 8 where they are also coupled to current source 12

$$\frac{I_{EE}}{2}.$$

Current source 4 and current source 12 are coupled to ground. The output current is taken to be the difference between the current values at node 6 and node 7.

The output current equation for FIG. 6 is $$I_O = \frac{-\alpha I_{EE}}{2}\left[\tanh\left(\frac{V_i}{2V_T} - \frac{\ln(r)}{2}\right) + \tanh\left(\frac{V_i}{2V_T} - \frac{\ln(r)}{2}\right)\right] \qquad (22)$$

After employing series expansion, the output current equation becomes:

$$I_O = -\alpha I_{EE}(1-d)\left\{\frac{V_i}{2V_T} + \left(d - \frac{1}{3}\right)\left(\frac{V_i}{2V_T}\right)^3 + \ldots\right\} \qquad (23)$$

where $$d = \left(\frac{r-1}{r+1}\right)^2. \qquad (24)$$

It is apparent from equation (23) that the output current value is maximally linear when $d = \frac{1}{3}$, or in other words $r = 2 + \sqrt{3} = 3.732$. If the circuit is employed with a more practical value such as (r=4) or (d=9/25), some overcompensation will result. In this case, $$I_O = -\frac{16}{25} \frac{\alpha I_{EE}}{2V_T} V_i = -0.64 g_m V_i \quad (25)$$

By inspection, the resulting transconductance of FIG. 6 equals only 64% of the transconductance defined in equation (10) of FIG. 1. For the case of r=4, the transfer characteristic of equation (22) is shown in FIG. 7. FIG. 7 shows that using differential pairs in parallel with transistor ratios allows for a greater input voltage linear range compared to the use of a simple differential amplifier.

LEVEL SHIFTS TECHNIQUE

Often, DC level shifts are required between a transconductance output and the input of the next stage. In this case, one alternative is to use level shift stages to implement the required 1:r ratios of transistor area as is illustrated in FIGS. 8A and 8B. These two architectures have high-frequency advantages since identical minimum size (or smaller size) transistors can be used for the inner core.

Input voltage signal $V_i$ 1 is coupled differentially to transistors Q9, Q10, Q11 and Q12 with the positive node of voltage $V_i$ coupled to the bases of transistors Q9 and Q10 and the negative node of input voltage $V_i$ coupled to the bases of transistors Q11 and Q12. The collectors of transistors Q9, Q10, Q11 and Q12 are coupled to voltage supply $V_{CC}$. The emitters of transistors Q9, Q10, Q11 and Q12 are coupled to the bases of transistors Q1, Q7, Q8 and Q2, respectively. The emitters of transistors Q9, Q10, Q11 and Q12 are also coupled to current sources 13, 14, 15 and 16, respectively. The emitters of transistors Q1 and Q2 are coupled to each other at node 5 where they are also coupled to current source 4 $I_{EE}/2$. The negative node of current source 4 is coupled to ground. Transistors Q9 and Q12 have a transistor area ratio of 1:r, and transistors Q10 and Q11 also have a transistor area ratio of r:1. The emitters of transistors Q7 and Q8 are coupled to each other at node 8 where they are also coupled to current source 12 $I_{EE}/2$. The negative node of current source 12 is coupled to ground. The collectors of transistors Q1 and Q7 are coupled to each other at node 6 where they are also coupled to current source 2 $I_{EE}/2$. The collectors of transistors Q2 and Q8 are coupled to each other at node 7 where they are also coupled to current source 3 $I_{EE}/2$. Voltage supply of $V_{CC}$ is coupled to current sources 2 and 3.

With respect to FIG. 8B, input voltage signal $V_i$ 1 is coupled differentially with the positive node of the input signal coupled to the bases of transistors Q9 and Q13, and the negative node of the input signal coupled to the bases of transistors Q11 and Q14. The emitter of transistor Q9 is coupled to the base of transistor Q1 as well as coupled to current source 17 $2I_e$. The emitter of transistor Q13 is coupled to the base of transistor Q7 as well as coupled to current source 14 $I_e$. The emitter of transistor Q11 is coupled to the base of transistor Q8 as well as coupled to current source 18 to $2I_e$. The emitter of transistor Q14 is coupled to the base of transistor Q2 as well as coupled to current source 16 $I_e$.

Transistors Q9 and Q13 have a transistor area ratio of 1:r/2, and transistors Q11 and Q14 also have a transistor area ratio of 1:r/2. The collectors of transistors Q9, Q13, Q11 and Q14 are coupled to voltage supply $V_{CC}$. The emitters of transistors Q1 and Q2 are coupled to each other at node 5 where they are also coupled to current source 4 $I_{EE}/2$. The negative node of current source 4 is coupled to ground. The emitters of transistors Q7 and Q8 are coupled to each other at node 8 where they are also coupled to current source 12 $I_{EE}/2$. The negative node of current source 12 is coupled to ground.

The collectors of transistors Q1 and Q7 are coupled to each other at node 6 where they are also coupled to current source 2 $I_{EE}/2$. The collectors of transistors Q2 and Q8 are coupled to each other at node 7 where they are coupled to current source 3 $I_{EE}/2$. Current sources 2 and 3 are coupled to voltage supply $V_{CC}$. The output current value is taken from the difference between the current values of node 6 and node 7.

With r=4, the linear input signal range for 1% THD is expanded 3 times compared to the emitter-coupled pair of FIG. 1. Equivalent input noise voltage is now given by:

$$\frac{V_n}{\sqrt{\Delta f}} = \frac{1}{\sqrt{0.64}} \sqrt{4KT\left(2R_b + \frac{1}{g_m}\right)}. \quad (26)$$

Therefore, equivalent input noise is 25% higher than in the emitter-coupled pair of FIG. 1, but the SNR improves by a factor of 2.4. The SNR improves when the tail currents are increased to maintain the original circuit's transconductance value.

Transistor simulations have shown that the linear range is slightly higher for r values above 4. For r values above 4.5 though, the distortion definitely starts to increase again. DC transfer characteristics for a few different r values are shown in FIG. 9. Curve 40 is the emitter-coupled pair curve illustrated in FIG. 2. Curve 41 is the curve based on the diagram given in FIGS. 8A and 8B with r equal to 3.5. Curves 42 and 43 are the linearity curves based on FIGS. 8A or 8B when r is equal to 4 and 4.5, respectively.

SUMMARY OF THE PRESENT INVENTION

A bipolar differential pair based transconductance element with improved linearity and signal to noise ratio is described. The circuit of the present invention comprises two sets of differential pairs of bipolar transistors in parallel. Each differential pair implements transistor area ratios in the emitter areas. The present invention also comprises diodes that are coupled to the emitters of the transistors of the differential pairs. When the device areas are ratioed properly, the range for the input voltage signal that still allows a linear output current equation increases by a factor of 2 over prior art circuits. The improved linearity, as well as improved signal-to-noise ratio, is achieved by coupling the diodes to the emitters of the transistors and also having the differential pairs in parallel with their transistor areas proportional to each other. An alternative embodiment of the present invention is also described which also uses a level shifting stage. In this embodiment, the required ratios can be set by means of the level shift transistors allowing for the use of all identical core transistors and diodes. Since all the identical core transistors and diodes are minimum size, this reduces the parasitics and extends the high frequency operating range of the circuit.

DETAILED DESCRIPTION OF THE PRESENT INVENTION

A bipolar differential pair based transconductance with extended linearity and improved signal to noise ratio is described. In the following description, numerous specific details, such as transistor area ratios and diode area ratios, etc., are described in detail in order to provide a more thorough description of the present invention. It will be apparent, however, no one skilled in the art, that the present invention may be practiced without these specific details. In other instances, well known features have not been described in detail in order not to unnecessarily obscure the present invention.

Figure 10:
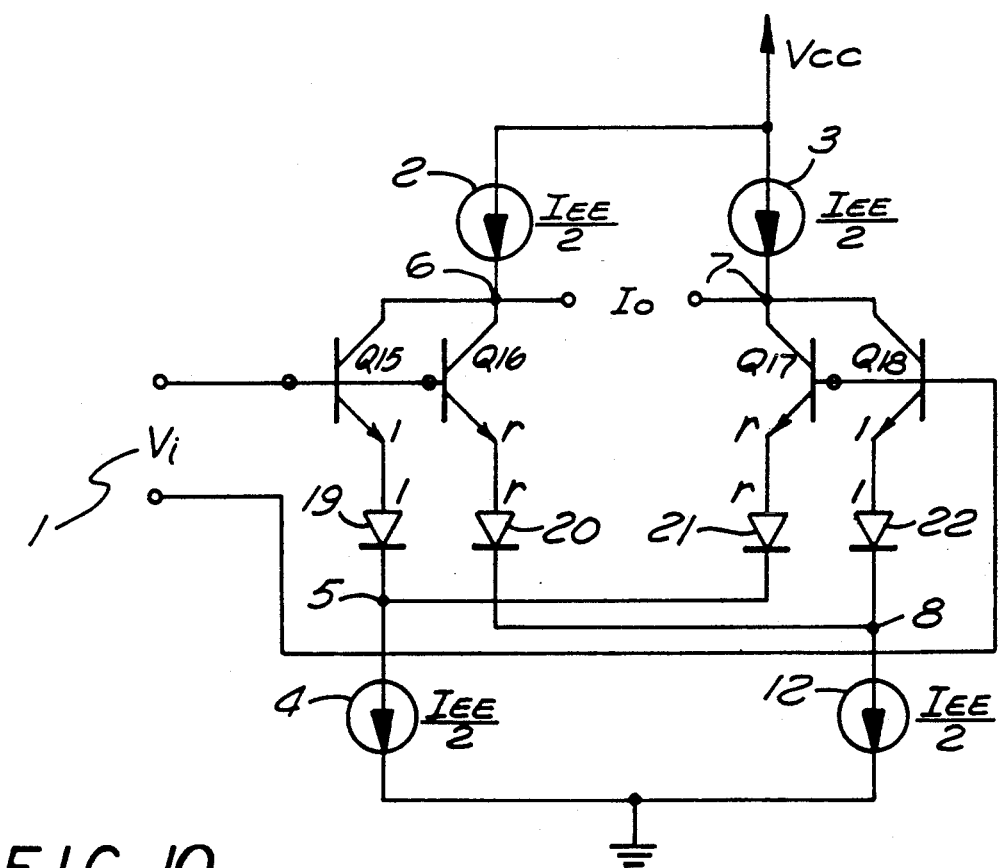
FIG. 10 is a circuit diagram illustrating the parallel bipolar differential pairs of the present invention.

The preferred embodiment of the present invention is illustrated in FIG. 10. The transconductance circuit comprises a first and second differential input signal with the circuit providing a differential output signal. Each differential pair's two transistors have ratioed transistor areas. A diode is coupled to each emitter of the transistors of the transconductance circuit and the diode areas are designed to follow the same ratios set by the transistors the diodes are coupled to.

Input voltage signal $V_i$ 1 of FIG. 10 is differentially coupled to the BJT transistors, with the positive node of $V_i$ coupled to the bases of transistors Q15 and Q16, while the negative node of $V_i$ is coupled to the bases of transistors Q17 and Q18. The emitter of transistor Q15 is coupled to the positive node of diode 19 while the negative node of diode 19 is coupled to the negative node of diode 21 at node 5. The positive node of diode 21 is coupled to the emitter of transistor Q17. Node 5 is coupled to ground through current source 4 $I_{EE}/2$.

The transistor areas of transistors Q15 and Q17 have a ratio of 1:r, while the diode areas of diodes 19 and 21 also have a ratio of 1:r. The emitter of transistor Q16 is coupled to the positive node of diode 20 while the negative node of diode 20 is coupled to the negative node of diode 22 at node 8. The emitter of transistor Q18 is coupled to the positive node of diode 22. Node 8 is also coupled to ground through current source 12 $I_{EE}/2$. The transistor areas of transistors Q16 and Q18 have a ratio of r:1, while the diode areas of diodes 20 and 22 also have a ratio of r:1. The collectors of transistors Q15 and Q16 are coupled to the negative node of current source 2 $I_{EE}/2$ at node 6 while the collectors of transistors Q17 and Q18 are coupled to the negative node of current source 3 $I_{EE}/2$ at node 7. Voltage supply $V_{CC}$ is coupled to the positive nodes of current sources 2 and 3.

The expression for $I_O$ is as follows:

$$I_O = -\frac{\alpha I_{EE}}{2}\left[\tanh\left(\frac{V_i}{4V_T} - \frac{\ln(r)}{2}\right) + \tanh\left(\frac{V_i}{4V_T} + \frac{\ln(r)}{2}\right)\right] \quad (27)$$

$$I_O = -\alpha I_{EE}(1-d)\left\{\frac{V_i}{4V_T} + \left(d - \frac{1}{3}\right)\left(\frac{V_i}{4V_T}\right)^3 + \ldots\right\} \quad (28)$$

where $$d = \left(\frac{r-1}{r+1}\right)^2 \quad (29)$$

For this circuit, equation (28) is again maximally linear for $d=\frac{1}{3}$, or $r=2+\sqrt{3}=3.732$. In the more practical case $r=4$ or ($d=9/25$), some overcompensation can result. In that case, the output current becomes $$I_O = -\frac{8}{25} \cdot \frac{\alpha I_{EE}}{2V_T} V_i = -0.32 g_m V_i \quad (30)$$

Figure 11:
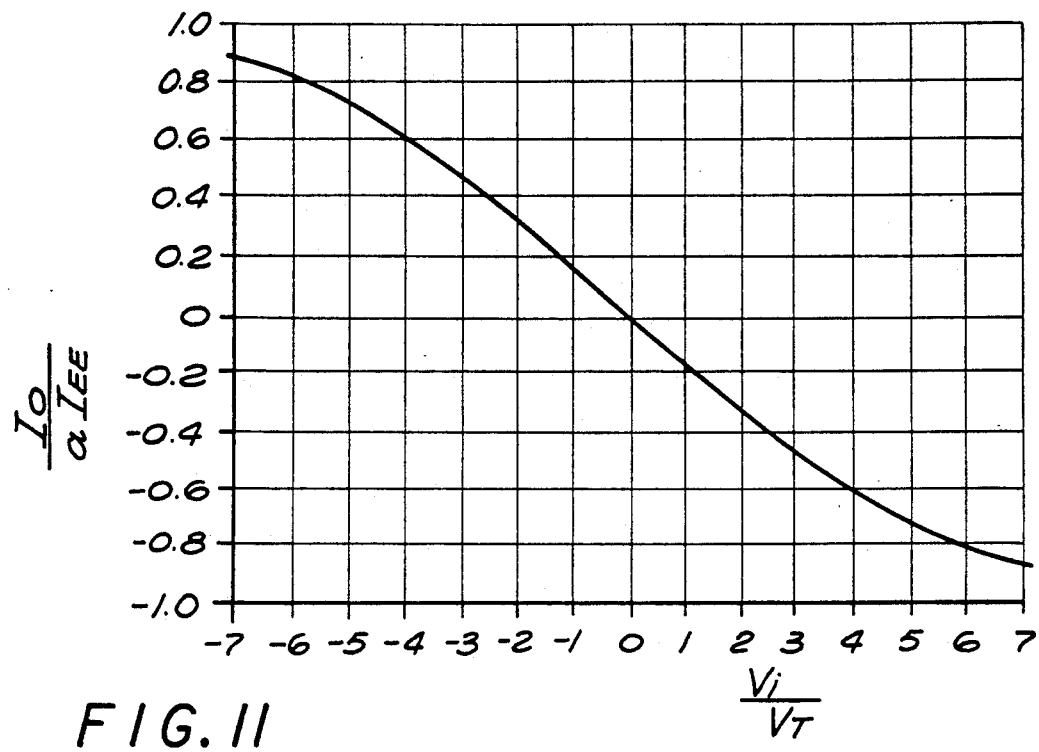
FIG. 11 is a graph illustrating the DC transfer characteristic for the circuit of the present invention illustrated in FIG. 10 (r=4).

It can be seen from equation (30) that the resulting transconductance equals 32% of the transconductance defined in equation (10), and is reduced by 50% compared to equation (25) for the parallel pairs without series diodes. For $r=4$, the transfer characteristic of equation (27) is shown in FIG. 11. By observation, the linear range for the input voltage is doubled compared to the result for the parallel pairs without diodes.

Figure 1:
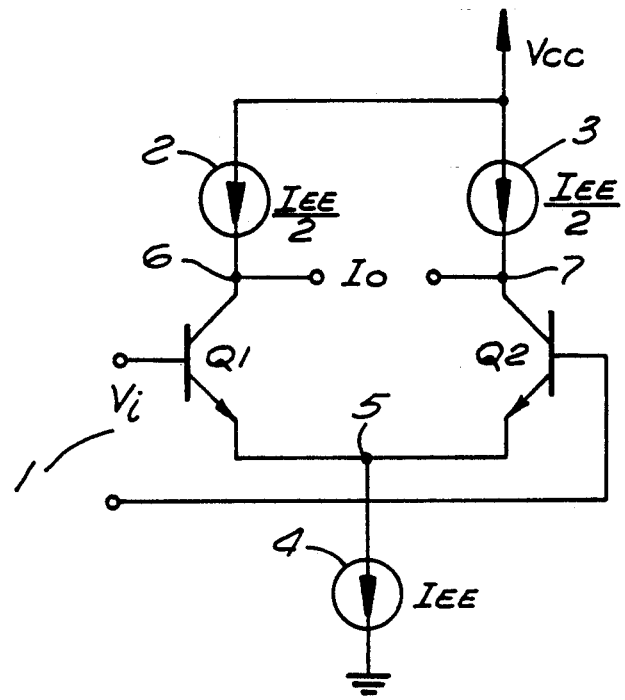
FIG. 1 is a circuit diagram illustrating a typical emitter-coupler pair.
Figure 2:
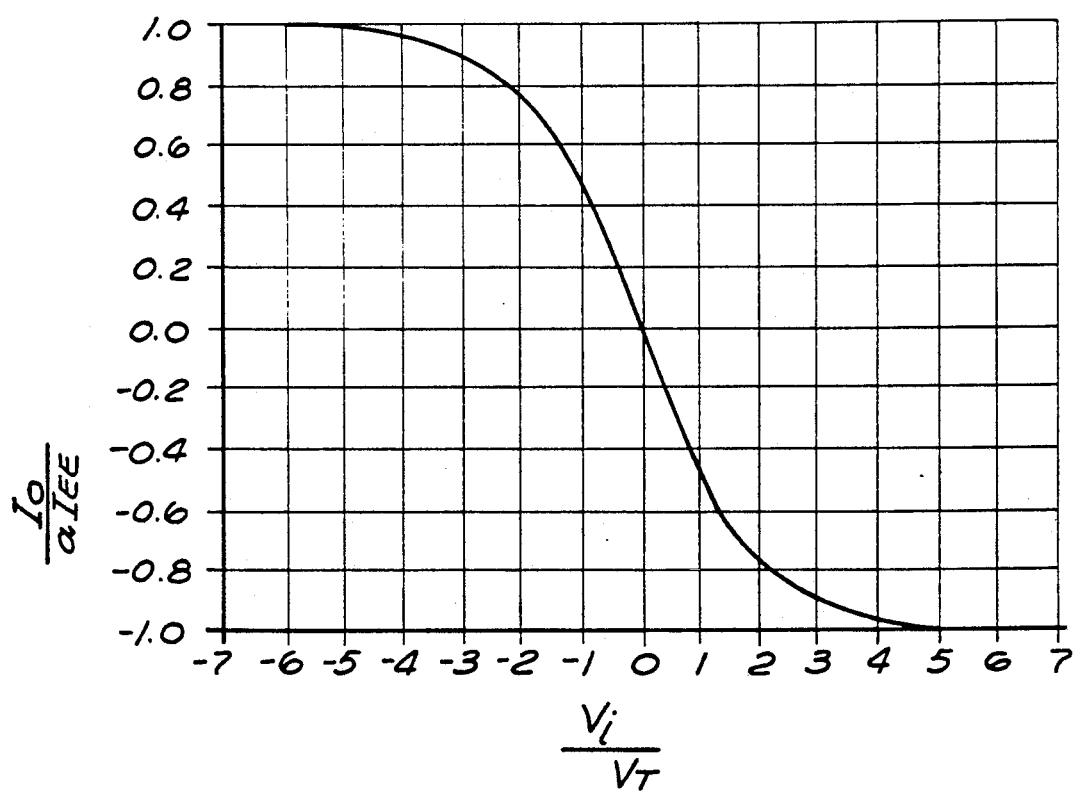
FIG. 2 is a graph illustrating the DC transfer characteristic for the circuit of FIG. 1.
Figure 3:
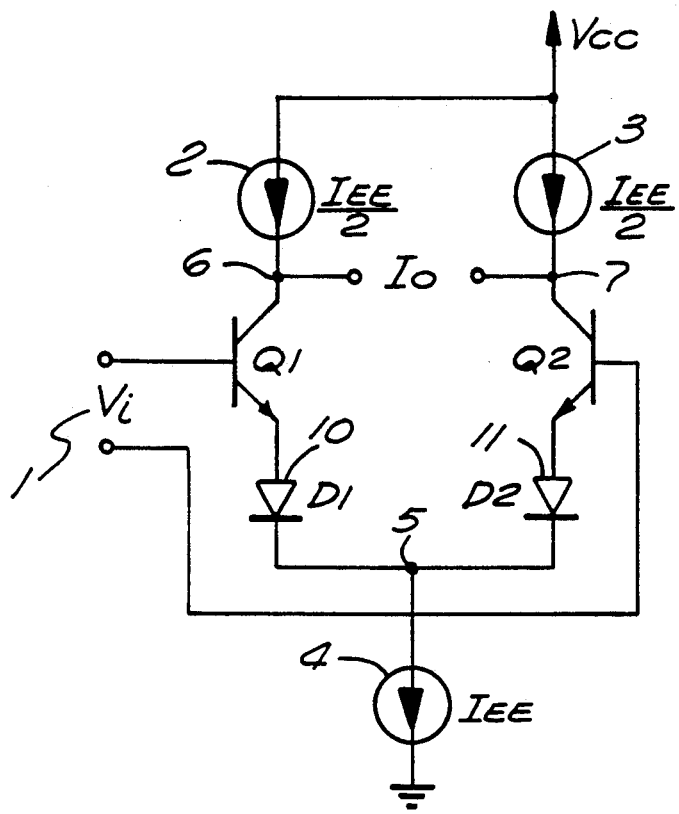
FIG. 3 is a circuit diagram illustrating an emitter-coupled pair with series diodes coupled to the emitters.
Figure 4:
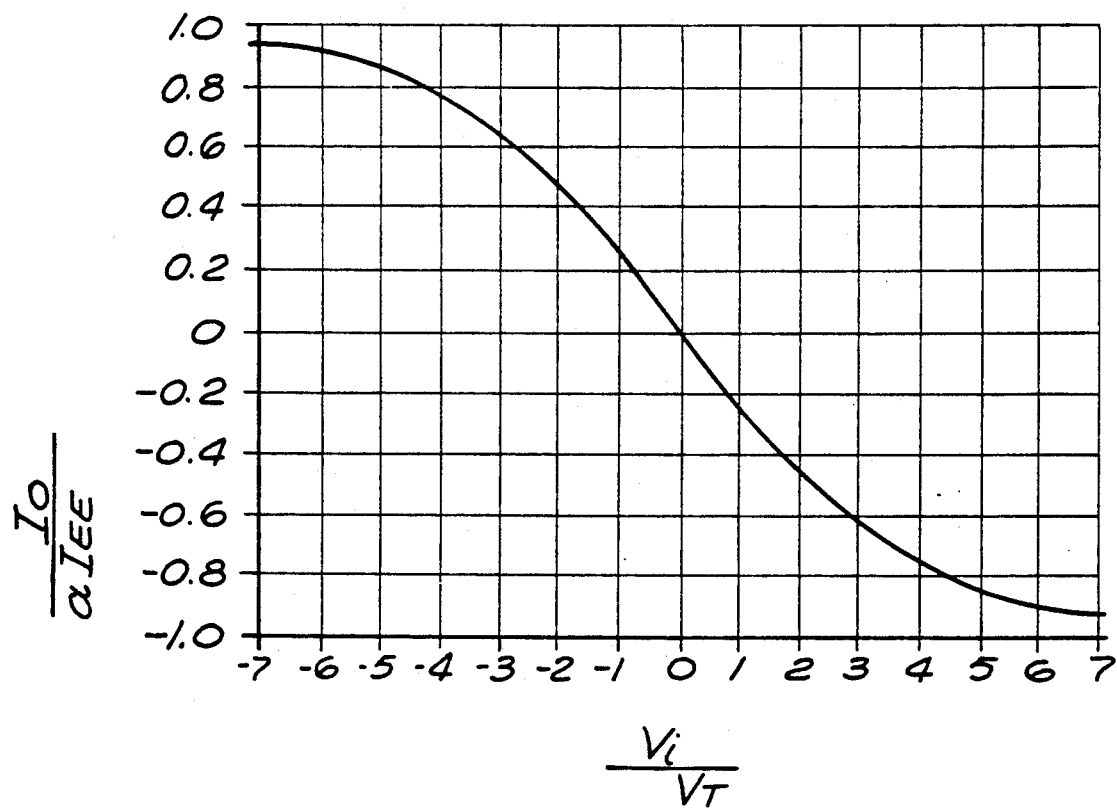
FIG. 4 is a graph illustrating the DC transfer characteristic for the circuit of FIG. 3.
Figure 5:
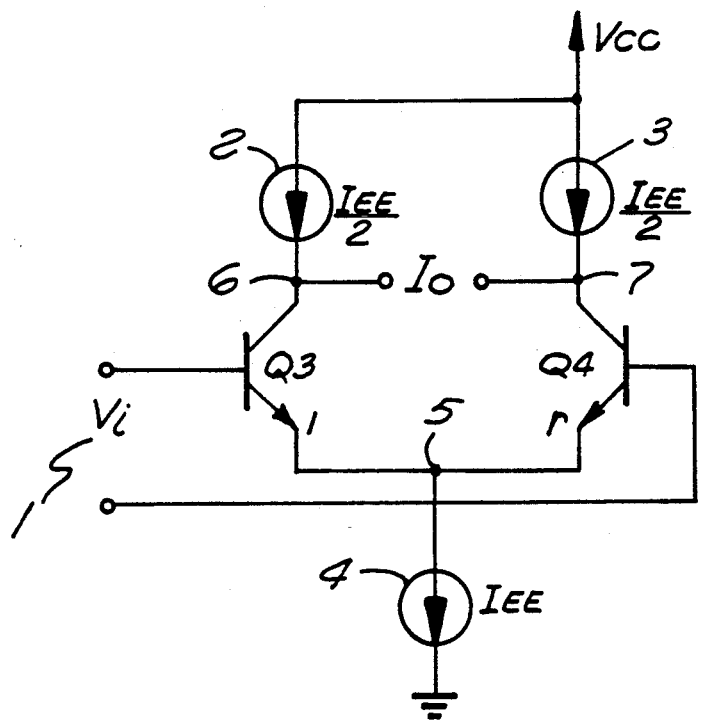
FIG. 5 is a circuit diagram illustrating a prior art differential pair with 1:r transistor area ratio.
Figure 6:
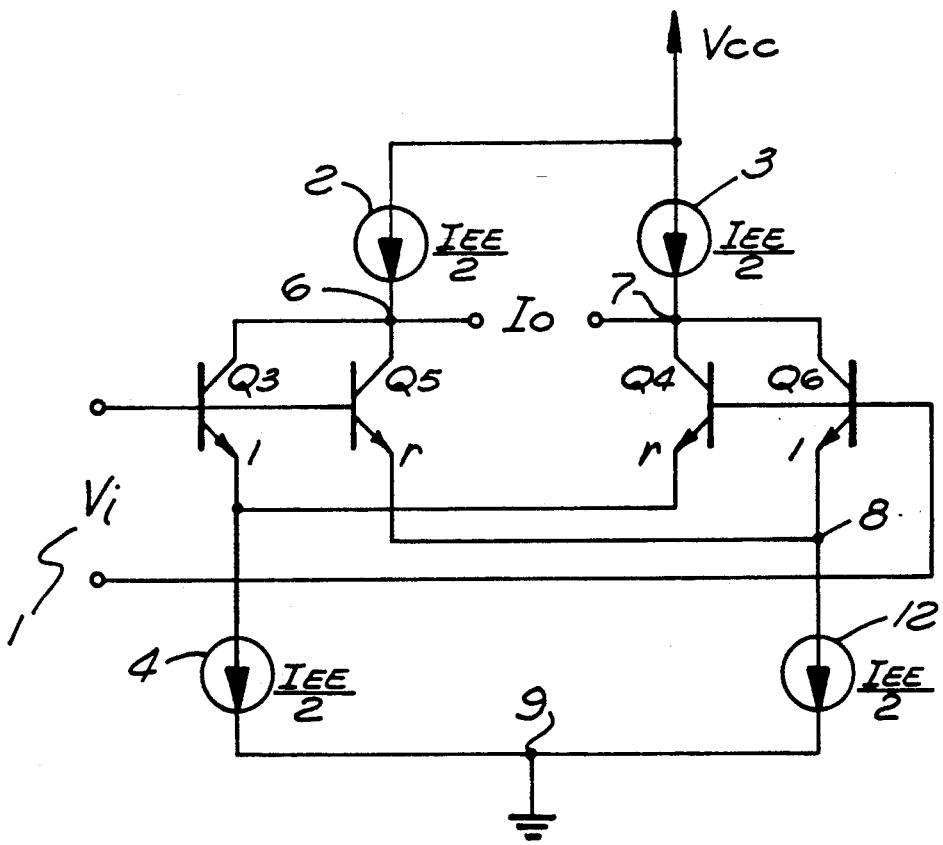
FIG. 6 is a circuit diagram illustrating a prior art scheme using two differential pairs with transistor area ratios 1:r and r:1 in parallel.
Figure 7:
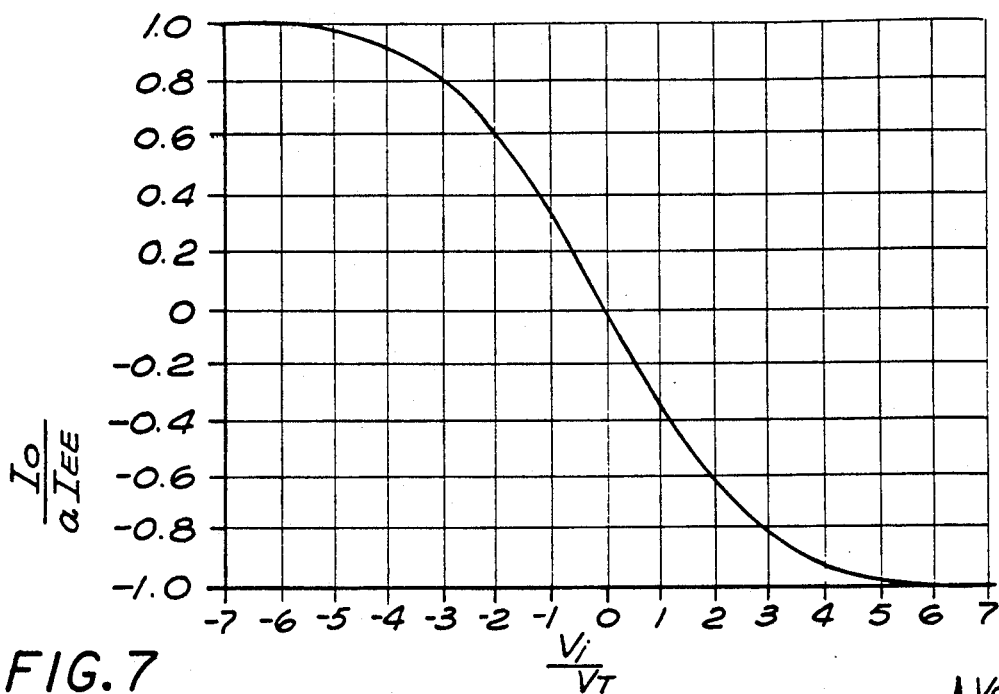
FIG. 7 is a graph illustrating the DC transfer characteristic for circuit of FIG. 6 (r=4).
Figure 8A:
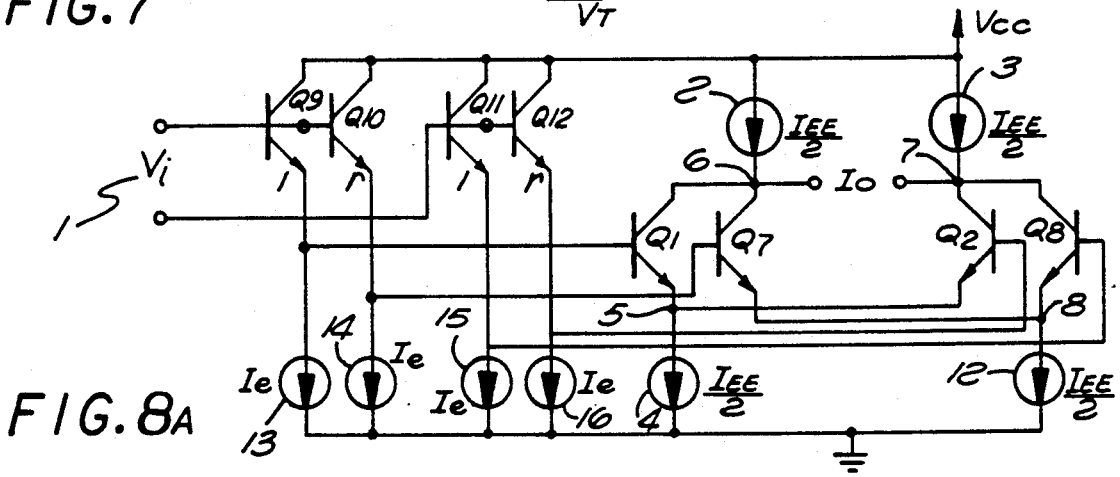
FIGS. 8a and 8b are circuit diagrams illustrating two methods of implementing the required 1:r transistor area ratios using levelshift circuitry.
Figure 8B:
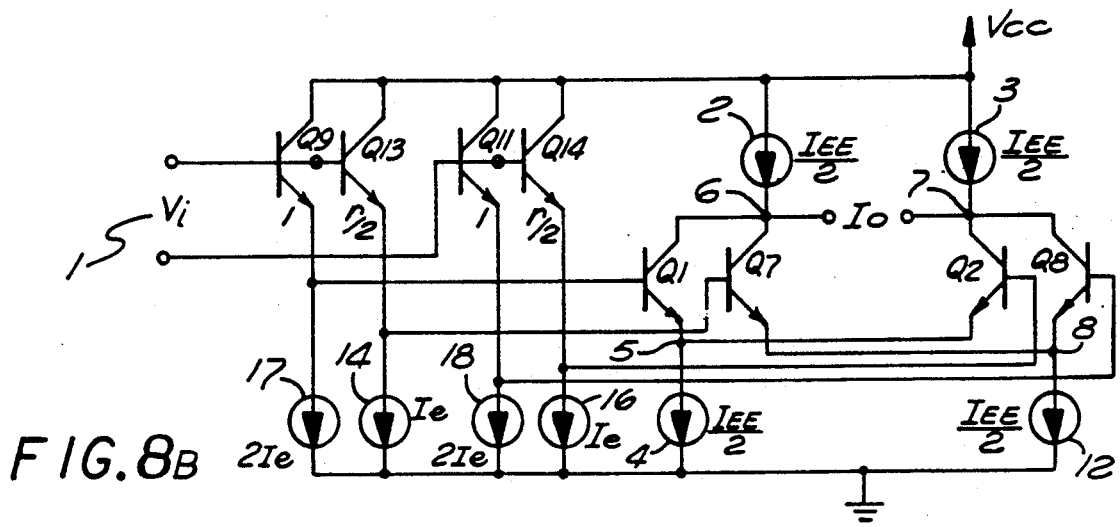
Figure 9:
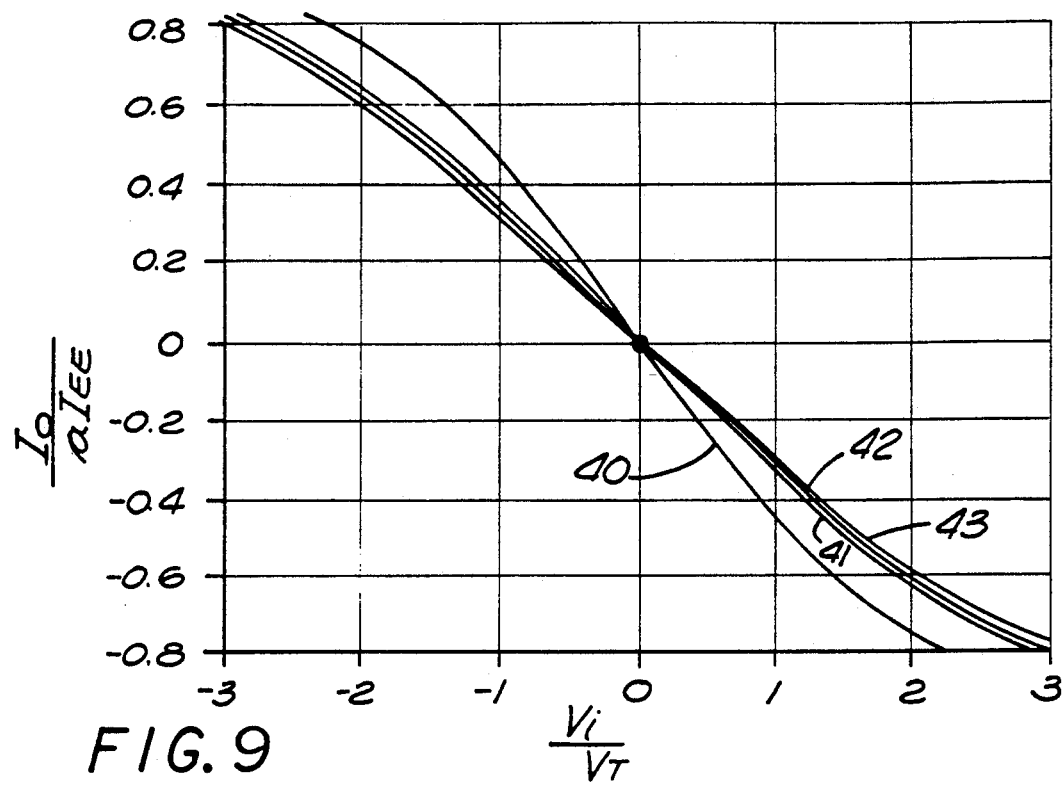
FIG. 9 is a graph illustrating transfer characteristics for different r values in the circuit of FIG. 6 compared to the emitter-coupled pair of FIG. 1.

The addition of the series diodes in the emitters of the transistors doubles the noise resistance of the circuit, and increases the equivalent input noise by a factor $\sqrt{2}$. Hence, the signal to noise ratio of the new circuit is 2.4 times $\sqrt{2}$ or 3.39 times better than for the simple emitter-coupled pair of FIG. 1, and $\sqrt{2}$ times better than for the circuit of FIG. 6. Further signal to noise ratio improvements can be obtained when the tail currents are increased to maintain the same equivalent transconductance as for FIG. 1, particularly when the base resistance $R_B$ is negligible compared to $\frac{1}{2} g_m$. This negligible comparison can generally be assured by choosing large composite transistors with multiple base and emitter stripes. In this limit situation the SNR improvement over the original emitter coupled pair can approach as much as $$\left(\frac{1}{\sqrt{0.32}}\right)(2.4)\sqrt{2} = 6$$

while the improvement over the parallel pairs without series diodes would be twofold.

Figure 12A:
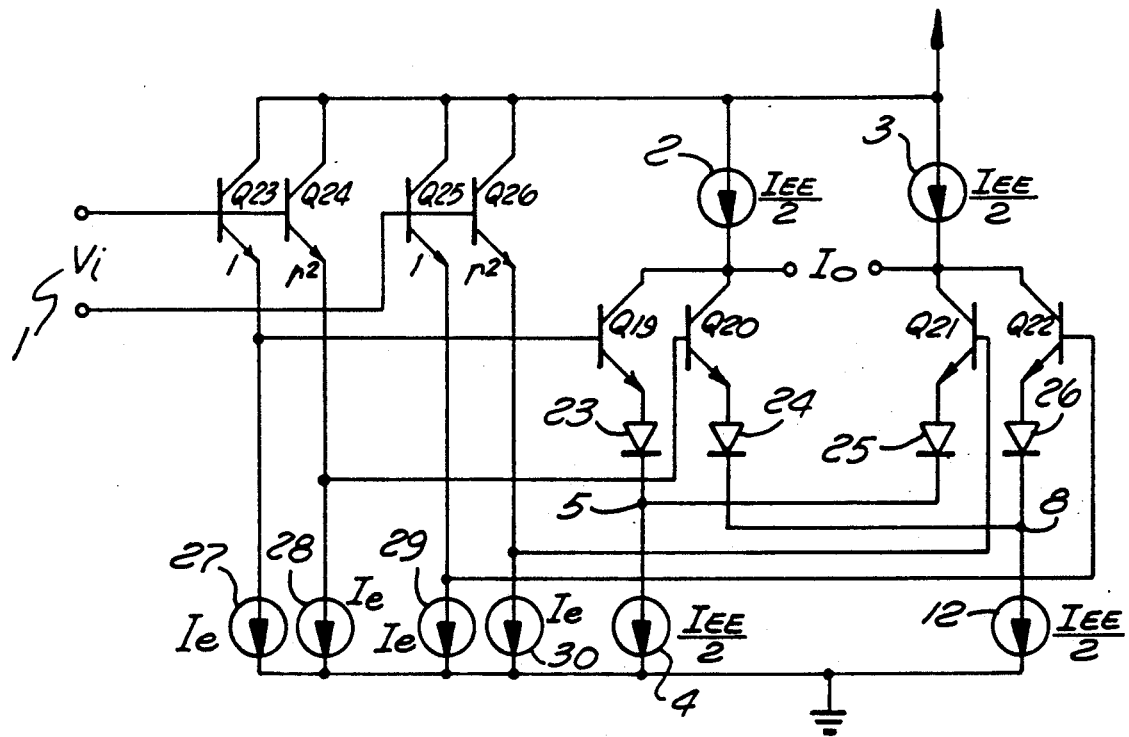
FIGS. 12a and 12b are circuit diagrams illustrating alternative embodiments of the present invention using levelshift circuitry.
Figure 12B:
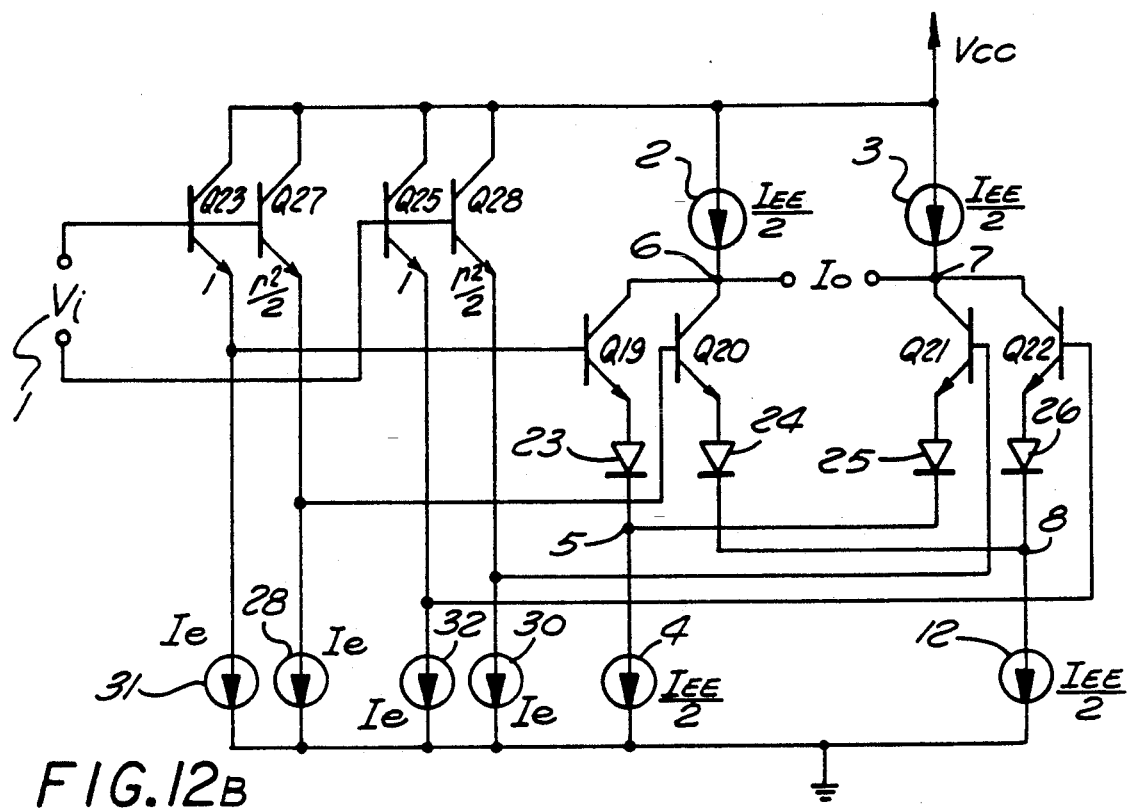

If level shifts are available, all identical core transistors and diodes can be used, and the required ratios can be set by means of the level transistors, as shown in the alternative embodiments of the present invention in FIGS. 12a and 12b. If all the level shift transistors are biased by the same current, the ratio must now be equal to 1:$r^2$ or (16 if r=4).

In FIG. 12a, input voltage signal 1 $V_i$ is coupled differentially so that the positive node of $V_i$ is coupled to the bases of transistors Q23 and Q24 while the negative node of $V_i$ is coupled to the bases of Q25 and Q26. The emitter of Q23 is coupled to the base of transistor Q19 as well as being coupled to ground through current source 27 $I_e$. The emitter of transistor Q24 is coupled to the base of transistor Q20 as well as coupled to ground through current source 28 $I_e$. The emitter of transistor Q25 is coupled to the base of transistor Q22 as well as coupled to ground through current source 29 $I_e$. The emitter of transistor Q26 is coupled to the base of transistor Q21 as well as coupled to ground through current source 30 $I_e$. Transistors Q23 and Q26 have a transistor area ratio of 1:$r^2$ while transistors Q24 and Q25 have a transistor area ratio of $r^2$:1. The emitter of transistor Q19 is coupled to the positive node of diode 23 while the negative node of diode 23 is coupled to the negative node of diode 25 at node 5. Node 5 is also coupled to ground through current source 4 $I_{EE}/2$.

The emitter of transistor Q21 is coupled to the positive node of diode 25. The emitter of transistor Q20 is coupled to the positive node of diode 24 while the negative node of diode 24 is coupled to the negative node of diode 26 at node 8. Node 8 is also coupled to ground through current source 12 $I_{EE}/2$. The emitter of transistor Q22 is coupled to the positive node of diode 26. The collectors of transistors Q19 and Q20 are coupled to current source 2 $I_{EE}/2$ at node 6. The collectors of transistors Q21 and Q22 are coupled to current source 3 $I_{EE}/2$ at node 7. Supply voltage $V_{CC}$ is coupled to current sources 2 and 3 as well as being coupled to the collectors of transistors Q23, Q24, Q25 and Q26.

The architecture of FIG. 12b is similar to the architecture of FIG. 12a except that the current source values in the emitters of transistors Q23 and Q25 of the levelshift stage have been increased to compensate for and reduce the very large transistor area ratios in the levelshift stage. Implementing larger current source values allows the reduction of the undesirable high transistor area ratio feature requiring large amount of silicon area space. In FIG. 12b, the emitter of transistor Q23 is coupled to current source 31 2$I_e$ and the emitter of transistor Q25 is also coupled to new current source 32 2$I_e$. Another difference between FIGS. 12b and 12a is that transistors Q24 and Q26 have been replaced by transistors Q27 and Q28, respectively. In this case, the transistor area ratio between transistors Q23 and Q28 is $$1: \frac{r^2}{2}$$

and the transistor area ratio between transistors Q27 and Q25 is $$\frac{r^2}{2}:1.$$

The current sources 31 and 32 are only one example of the current source values that can be used and are not limited to the example shown in FIG. 12B. Another implementation can have current sources 31 and 32 equal to 4$I_e$ reducing the transistor areas of transistors Q27 and Q28 to $$\frac{r^2}{4}.$$

All other features of FIG. 12b are the same as the features in FIG. 12a.

Figure 13:
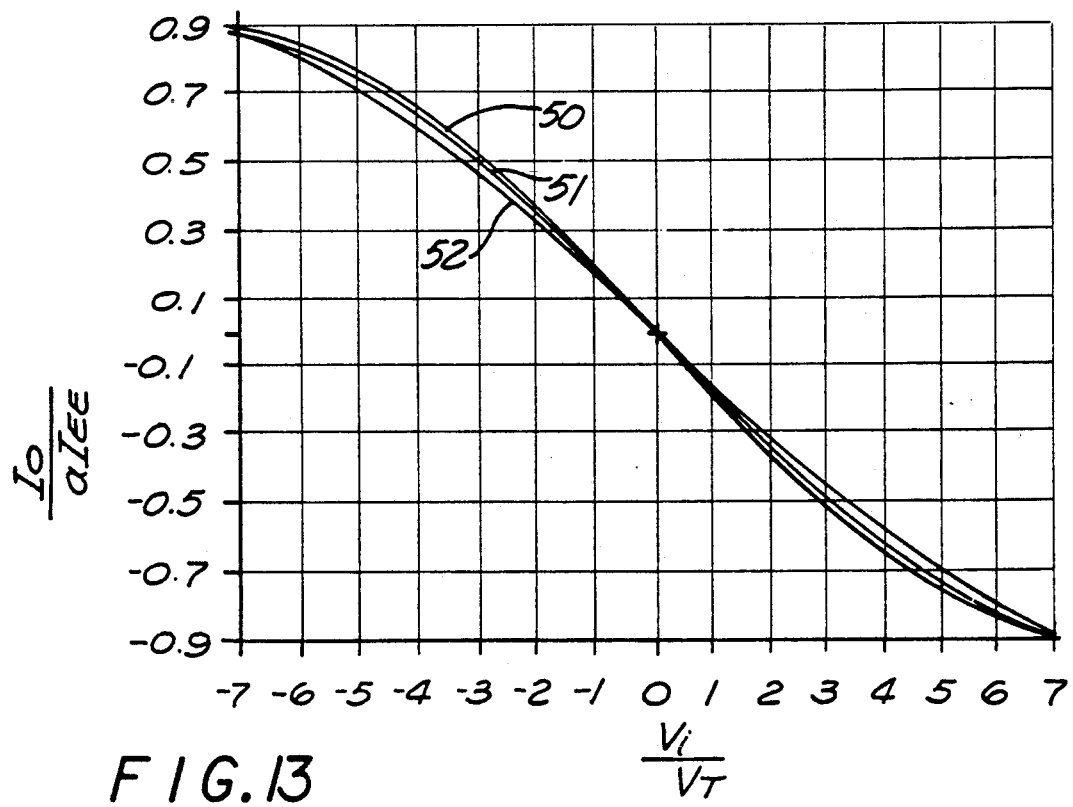
FIG. 13 is a graph illustrating the DC transfer characteristics for the circuit of the present invention for different r values.

Transistor simulations have shown that r ratios larger than four lead to slightly further reduced distortion levels. As in the case for the parallel pairs without series diodes, the distortion goes up again when r is made larger than approximately 4.5. The DC transfer characteristics obtained for different r values for the circuit of FIG. 10 are shown in FIG. 13. The graph of FIG. 13 shows that the practical case of r=4 is the optimum choice for extended input voltage linearity. Curve 50 shows the case when r is equal to 3.5. Curves 51 and 52 of FIG. 13 illustrates the case when r is equal to 4 and 4.5, respectively.

The transconductance circuit of the present invention increases the linear range by factor of 2 over the best performing prior art circuit, and improves the signal to noise ratio by at least $\sqrt{2}$, while the transconductance is halved. If the original transconductance value is maintained (i.e. by increasing the power consumption), the signal to noise ratio improvement can also approach a factor of 2 with proper transistor choice.

Thus a transconductance circuit with extended linearity and improved signal to noise ratio has been described.

We claim:

1. A transconductance circuit comprising:
   a transconductance element with a first and second differential pair of transistors in parallel having transistor area ratios of 1:r and r:1, respectively; said first and second pair of transistors coupled to a differential input signal, said transconductance element providing a differential current output signal;
   a plurality of diodes coupled to said transconductance element, said diodes for improving linearity of said transconductance element;
   wherein emitters of said first and second differential pair of transistors are coupled to said diodes, said diodes coupled to said emitters of said first differential pair of transistors having a diode area ratio of 1:r, and said diodes coupled to said emitters of said second differential pair of transistors having a diode area ratio of r:1.

2. The circuit of claim 1 wherein r is approximately equal to 4.

3. A transconductance circuit comprising:
   a transconductance element with a first and second differential pair of transistors in parallel coupled to a differential input signal, said transconductance element providing a differential current output signal;

a plurality of diodes coupled to said transconductance element, said diodes for improving linearity of said transconductance element;

first and second transistors comprising said first differential pair, said first and second transistors coupled differentially to said input signal;

an emitter of said first transistor, and an emitter of said second transistor coupled to a first node through first and second diodes respectively;

third and fourth transistors of said second differential pair, said third and fourth transistors coupled differentially to said input signal;

an emitter of said third transistor, and an emitter of said fourth transistor coupled to a second node through third and fourth diodes respectively;

a supply voltage coupled to the collectors of said first and third transistors and to the collectors of said second and fourth transistors through first and second current sources respectively;

said first differential pair with said first and second transistors having a transistor area ratio of 1:r, and said second differential pair, with said third and fourth transistors coupled in parallel with said first differential pair, having a transistor area ratio of r:1;

said first differential pair coupled to said first and second diodes having a diode area ratio of 1:r, and said third and fourth diodes coupled to said second differential pair having a diode area ratio of r:1.

4. The circuit of claim 3 wherein r is approximately equal to 4.

5. A transconductance circuit comprising.

first, second, third and fourth transistors wherein said first and second transistors are coupled differentially to an input signal with said third and fourth transistors;

said first and fourth transistors having a transistor area ratio of 1:r$^2$, and wherein said second and third transistors have a transistor area ratio of r$^2$:1;

emitter of said first transistor coupled to a first transistor of a first differential pair and emitter of said fourth transistor coupled to a second transistor of said first differential pair;

an emitter of said second transistor coupled to a first transistor of a second differential pair, and emitter of said third transistor coupled to the second transistor of said second differential pair;

an emitter of said first transistor of said first differential pair and emitter of said second transistor of said first differential pair coupled to a first node through first and second diodes respectively;

an emitter of said first transistor of said second differential pair and emitter of second transistor of said second differential pair coupled to a second node through third and fourth diodes respectively;

a supply voltage coupled to the collectors of said first transistor of said first differential pair and said first transistor of said second differential pair, and to the collectors of said second transistor of said first differential pair and said second transistor of said second differential pair through first and second current sources respectively.

6. The circuit of claim 5 wherein r is approximately equal to 4.

7. The circuit of claim 5 wherein said emitters of said first, second, third and fourth transistors are coupled a third, fourth, fifth and sixth current source respectively, said third, fourth, fifth and sixth current source having equal magnitude.

8. A transconductance circuit comprising:

first, second, third and fourth transistors wherein said first and second transistors are coupled differentially to an input signal with said third and fourth transistors;

said first and fourth transistors having a transistor area ratio of $$1: \frac{r^2}{2},$$

and wherein said second and third transistors have a transistor area ratio of $$\frac{r^2}{2} :1;$$

an emitter of said first transistor coupled to a first transistor of a first differential pair and emitter of said fourth transistor coupled to a second transistor of said first differential pair;

an emitter of said second transistor coupled to a first transistor of a second differential pair, an emitter of said third transistor coupled to the second transistor of said second differential pair;

an emitter of said first transistor of said first differential pair and an emitter of said second transistor of said first differential pair coupled to a first node through first and second diodes respectively;

an emitter of said first transistor of said second differential pair and an emitter of second transistor of said second differential pair coupled to a second node through third and fourth diodes respectively;

a supply voltage coupled to the collectors of said first transistor of said first differential pair and said first transistor of said second differential pair, and to the collectors of said second transistor of said first differential pair and said second transistor of said second differential pair through first and second current sources respectively.

9. The circuit of claim 8 wherein r is approximately equal to 4.

10. The circuit of claim 9 wherein said emitters of said first, second, third, and fourth transistors are coupled to a third, fourth, fifth and sixth current source respectively, said third and fifth current source having approximately twice the magnitude of said second and fourth current source.

11. A transconductance circuit comprising:

a transconductance element with a first and second differential pair of transistors in parallel having transistor area ratios of 1:r and r:1, respectively; said first and second pair of transistors coupled to a differential input signal, said transconductance element providing a differential current output signal;

a plurality of diodes coupled to said transconductance element, said diodes for improving linearity of said transconductance element;

wherein emitters of said first and second differential pair of transistors are coupled to said diodes, said diodes coupled to said emitters of said first differential pair of transistors having a diode area ratio of 1r, and said diodes coupled to said emitters of said second differential pair of transistors having a diode area ratio of r:1;

wherein said transconductance element comprises:

first and second transistors, said first and second transistors coupled differentially to said input signal;

an emitter of said first transistor and an emitter of said second transistor coupled to a first node through first and second diodes, respectively;

third and fourth transistors, said third and fourth transistors coupled differentially to said input signal;

an emitter of said third transistor and an emitter of said fourth transistor coupled to a second node through third and fourth diodes, respectively;

a supply voltage coupled to the collectors of said first and third transistors and to the collectors of said second and fourth transistors through first and second current sources, respectively.

12. The circuit of claim 11 wherein r is approximately equal to 4.

13. A transconductance circuit comprising:

a transconductance element with a first and second differential pair of transistors in parallel having transistor area ratios of 1:r and r:1, respectively; said first and second pair of transistors coupled to a differential input signal, said transconductance element providing a differential output signal;

a plurality of diodes coupled to said transconductance element, said diodes for improving linearity of said transconductance element;

wherein emitters of said first and second differential pair of transistors are coupled to said diodes, said diodes coupled to said emitters of said first differential pair of transistors having a diode area ratio of 1:r, and said diodes coupled to said emitters of said second differential pair of transistors having a diode area ratio of r:1;

wherein said transconductance element comprises:

first and second transistors, said first and second transistors coupled differentially to said input signal;

third and fourth transistors, said third and fourth transistors coupled differentially to said input signal;

a supply voltage coupled to said first and third transistors and to said second and fourth transistors through first and second current sources respectively.

14. The circuit of claim 13 wherein r is approximately equal to 4.

15. A transconductance element comprising:

a transconductance element with a first and second differential pair of transistors in parallel having transistor area ratios of 1:r and r:1, respectively; said first and second pair of transistors coupled to a differential input signal, said transconductance element providing a differential output signal;

a plurality of diodes having nonidentical areas coupled to said transconductance element, said diodes for improving linearity of said transconductance element;

wherein said transconductance element comprises:

first and second transistors, said first and second transistors coupled differentially to said input signal;

third and fourth transistors, said third and fourth transistors coupled differentially to said input signal;

a supply voltage coupled to said first and third transistors and to said second and fourth transistors through first and second current sources, respectively.

16. The circuit of claim 15 wherein r is approximately equal to 4.

* * * * *